United States Patent
Near et al.

[11] Patent Number: 6,107,726
[45] Date of Patent: Aug. 22, 2000

[54] SERPENTINE CROSS-SECTION PIEZOELECTRIC LINEAR ACTUATOR

[75] Inventors: Craig D. Near, Acton; Brian G. Pazol, Northboro; Leslie J. Bowen, Concord, all of Mass.

[73] Assignee: Materials Systems, Inc., Littleton, Mass.

[21] Appl. No.: 09/041,278

[22] Filed: Mar. 11, 1998

Related U.S. Application Data

[63] Continuation-in-part of application No. 08/901,038, Jul. 25, 1997, abandoned
[60] Provisional application No. 60/022,634, Jul. 25, 1997.

[51] Int. Cl.[7] .................................................. H01L 41/08
[52] U.S. Cl. .......................... 310/328; 310/358; 310/359; 310/367
[58] Field of Search .................................. 310/357–359, 310/367, 368, 323, 328, 366

[56] References Cited

U.S. PATENT DOCUMENTS

| | | | |
|---|---|---|---|
| 2,497,108 | 2/1950 | Williams | 310/367 X |
| 3,470,394 | 9/1969 | Cook et al. | 310/367 |
| 3,816,774 | 6/1974 | Ohnuki et al. | 310/8.6 |
| 4,028,566 | 6/1977 | Franssen et al. | 310/367 |
| 4,056,742 | 11/1977 | Tibbetts | 310/357 |
| 4,071,880 | 1/1978 | Rutt | 428/292 |
| 4,353,957 | 10/1982 | Rutt et al. | 428/178 |
| 4,469,978 | 9/1984 | Hamada | 310/366 |
| 4,554,558 | 11/1985 | Beaudet et al. | 346/75 |
| 4,587,528 | 5/1986 | Beaudet | 346/75 |
| 4,638,206 | 1/1987 | Tsunooka et al. | 310/359 X |
| 4,752,788 | 6/1988 | Yasuhara | 346/140 R |
| 4,842,493 | 6/1989 | Nilsson | 417/322 |
| 5,173,605 | 12/1992 | Hayes et al. | 250/306 |
| 5,208,880 | 5/1993 | Riza et al. | 385/18 |
| 5,245,734 | 9/1993 | Issartel | 310/328 |
| 5,340,050 | 8/1994 | Bowen | 310/322 |
| 5,341,062 | 8/1994 | Cero, Jr. et al. | 310/339 |
| 5,410,207 | 4/1995 | Miura et al. | 310/328 |
| 5,440,194 | 8/1995 | Beurrier | 310/328 |
| 5,451,827 | 9/1995 | Tagaki | 310/323 |
| 5,553,035 | 9/1996 | Seyed-Bolorfor-osh et al. | 367/140 |
| 5,559,387 | 9/1996 | Beurrier | 310/32.8 |
| 5,597,494 | 1/1997 | Kohno et al. | 216/6 |
| 5,598,050 | 1/1997 | Bowen et al. | 310/367 X |
| 5,633,554 | 5/1997 | Kaji | 310/328 |

FOREIGN PATENT DOCUMENTS

| | | | |
|---|---|---|---|
| 3833109A | 5/1990 | Germany . | |
| 55-114099 | 3/1980 | Japan . | |
| 58-51578 | 3/1983 | Japan | 310/367 |
| 63-156377 | 6/1988 | Japan | 310/311 |
| 63-289975 | 11/1988 | Japan | 310/311 |
| 6-164007 | 6/1994 | Japan . | |

*Primary Examiner*—Mark O. Budd
*Attorney, Agent, or Firm*—Pearson & Pearson; Walter F. Dawson

[57] ABSTRACT

A serpentine cross-section piezoelectric linear actuator includes a unitary, densified, rigid, monolithic piezoelectric or electrostrictive ceramic body, the body including a top, four sides generally normal to and interconnected with the top, a base generally normal to and interconnected with the sides, and two or more ceramic layers including a top ceramic layer providing the top, a bottom ceramic layer providing the bottom, and, optionally, one or more intermediate ceramic layers, the layers being disposed parallel to and superimposed over one another. Each ceramic layer except the top ceramic layer is joined at a first side to one of the ceramic layers adjacent thereto by a first ceramic bridge and each ceramic layer except the bottom ceramic layer is joined at a second side opposite the first side to another of the ceramic layers adjacent thereto by a second ceramic bridge. First and second cavities extend into the ceramic body from the first and second sides, respectively, the first cavities alternating with the second cavities in the ceramic body, so that the ceramic body has a serpentine cross-section. The body further includes a first electrode and a second electrode, each of an electrically conductive material. The first and second electrodes are disposed along and bonded to the first and second sides, respectively, of the body for activation of the actuator. The actuator may be poled and electroded in, e.g., a $d_{33}$, $d_{15}$, or $d_{31}$, configuration for linear expansion of the actuator.

41 Claims, 11 Drawing Sheets

SERPENTINE CROSS-SECTION PIEZOELECTRIC LINEAR ACTUATOR

CROSS-REFERENCE TO RELATED APPLICATIONS

This application claims benefit of Provisional Application Ser. No. 60/022,634, filed Jul. 25, 1997. This application is a continuation-in-part of U.S. patent application Ser. No. 08/901,038, filed Jul. 25, 1997, now abandoned. This application is also related to U.S. patent application Ser. No. 08/686,496. Applications 08/901,038 and 08/686,496 are commonly assigned herewith and are incorporated herein by reference.

GOVERNMENT CONTRACT INFORMATION

The Government of the United States of America has certain rights in this invention pursuant to Contract No. NAS1-97015, awarded by or for the U.S. National Aeronautics and Space Administration.

BACKGROUND OF THE INVENTION

The present invention relates to low voltage, high displacement piezoelectric ceramic actuators. These actuators are useful for such military and commercial applications as: vibration damping, noise suppression, acoustic camouflage, actuated structures and positioning. Additionally, these actuators may be grouped in multiple arrangements and operated simultaneously so that their force and strain outputs are additive, or grouped and operated individually, to achieve acoustic signal generation, e.g., in acoustic imaging or transmitting, or in acoustic communication.

In order to meet the requirements presented by such applications, piezoelectric actuators must exhibit both moderate-to-high displacement and moderate-to-high force. Thus far, piezoelectric actuators have been limited by the need to balance displacement and force requirements in the device. For example, the choice has been between low displacement with high force (monolithic or multilayer piezoelectric ceramic actuators) or high displacement with low force (piezoelectric benders and strain amplifiers). Little capability has existed for varying the force-displacement characteristics to suit a particular application.

Several types of piezoelectric devices have been developed to meet the need for high displacement actuation. These devices all increase the displacement at the expense of load carrying capability. In most of these devices, an additional performance penalty arises from energy losses in the strain amplification mechanism. Examples of such devices include piezoelectric benders, Inchworm motors, and flextensional actuators. Piezoelectric bender devices can exhibit high bending strain levels of up to 10%, but their load carrying capabilities are only on the order of $10^{-4}$ MPa. The Inchworm motor can exhibit large lateral displacements and reasonable loads, but its speed is limited. Flextensional actuators have been used as strain amplification devices for both single layer and multilayer piezoelectric materials, with typical strain amplification of about a factor of 5, but with about a 1000-fold decrease in load carrying capability.

To meet the requirements described above, more efficient actuators that combine high energy density (for compactness) with moderate strain amplification (for matching to moderate mechanical impedance loads) are required.

Accordingly, it is an object of the present invention to provide a piezoelectric actuator which overcomes the disadvantages of the prior art.

It is another object of the invention to provide a linear piezoelectric actuator which can be more economically fabricated than those found in the prior art.

It is yet another object of the invention to provide a linear piezoelectric actuator which combines high displacement with moderate to high actuation force.

It is still another object of the invention to provide a moderate displacement linear piezoelectric actuator having high actuation force.

It is a further object of the invention to provide net-shape forming techniques for readily and economically fabricating a linear piezoelectric actuator.

BRIEF DESCRIPTION OF THE DRAWINGS

For a better understanding of the present invention, together with other objects, features, advantages, and capabilities thereof, reference is made to the following Description and appended claims, together with the Drawing in which:

SUMMARY OF THE INVENTION

Figure 1:
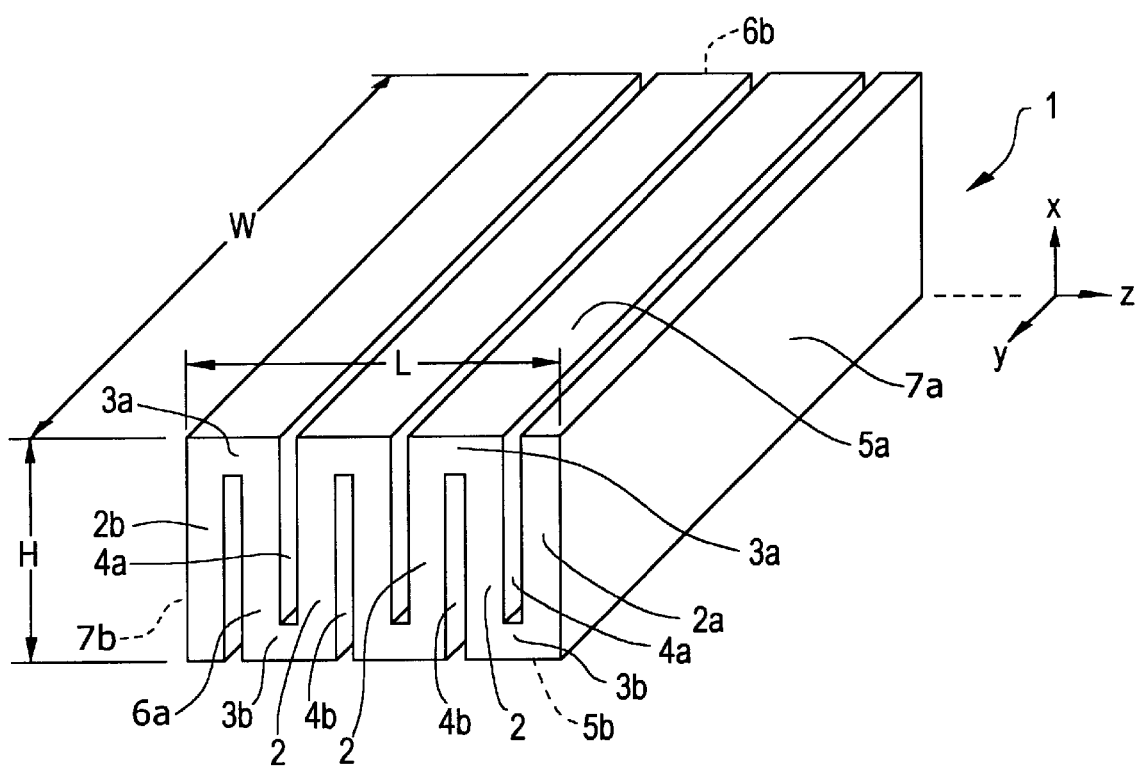
FIG. 1 is a perspective view of a PZT blank used for fabrication of the devices described herein.

In one embodiment, the invention is a serpentine cross-section piezoelectric linear actuator. The actuator includes a unitary, densified, rigid, monolithic, poled piezoelectric or electrostrictive ceramic body, the body including a top, four sides generally normal to and interconnected with the top, a base generally normal to and interconnected with the sides, and two or more ceramic layers including a top ceramic layer providing the top, a bottom ceramic layer providing the bottom, and, optionally, one or more intermediate ceramic layers, the layers being superimposed over one another. Each ceramic layer except the top ceramic layer is joined at a first side to one of the ceramic layers adjacent thereto by a first ceramic bridge and each ceramic layer except the bottom ceramic layer is joined at a second side opposite the first side to another of the ceramic layers adjacent thereto by a second ceramic bridge. First and second cavities extend into the ceramic body from the first and second sides, respectively, the first cavities alternating with the second cavities in the ceramic body, so that the ceramic body has a serpentine cross-section. The body further includes a first electrode and a second electrode, each of an electrically conductive material. The first and second electrodes are disposed along and bonded to the first and second sides, respectively, of the body. The ceramic body is poled and electroded in a configuration selected to effect linear expansion of the actuator.

The ceramic body is poled and electroded in any of several different configurations to tailor the device to a particular application. In preferred embodiments, the ceramic is poled and electroded in a $d_{33}$, $d_{15}$, or $d_{31}$ configuration for linear expansion of the actuator.

DETAILED DESCRIPTION OF THE PREFERRED EMBODIMENTS

The description below of various illustrative embodiments shown in the Drawings is not intended to limit the scope of the present invention, but merely to be illustrative and representative thereof.

One exemplary embodiment of a piezoelectric ceramic actuator in accordance with the invention is a linear actuator including multiple lead zirconate titanate (PZT) ceramic layers with electrically conductive nickel electrodes, and has a cross-sectional footprint of about 0.1×0.1 to about 100× 100 mm, and a length of about 0.1–1000 mm. Alternatively, the actuator may be fabricated from another piezoelectric or electrostrictive material including, but not limited to, a lead magnesium niobate; a lead zinc niobate; a lead nickel niobate; a titanate, tungstate, zirconate or niobate of lead, barium, bismuth, or strontium; or a derivative thereof. Herein, for the sake of brevity, materials of this type will be referred to as piezoelectric materials. Also, another known electrically conductive material may be used to fabricate the electrodes of the actuator. Such electrically conductive materials include, but are not limited to, metals such as silver, palladium, or platinum, nickel, electroless nickel, vapor deposited or sputtered gold, chrome-gold, alloys of these metals, and conductive polymers or glasses.

The illustrative actuator is fabricated from a multilayer ceramic blank formed, e.g., molded, extruded, or diced from a piezoelectric material to have a serpentine cross section. FIG. 1 illustrates an example of such a blank, showing sintered PZT ceramic blank 1 of height H, width W, and length L (in the x, y, and z dimensions, respectively). Blank 1 has multiple parallel ceramic layers 2 interconnected by bridging portions 3a and 3b at alternating ends of layers 2 to form a ceramic body of serpentine cross-section. Alternating slits or cavities 4a and 4b entering blank 1 from opposite side surfaces 5a and 5b of blank 1 are interposed between layers 2 to separate the layers. Sides 6a and 6b have a serpentine cross-section, while top 7a and base 7b have a rectangular cross section.

Blank 1 is shown as having seven ceramic layers 2. However the layers in an individual actuator may vary from two to 1000, or even several thousand layers, while the thickness of each layer is typically about 10–10,000 μm and the length (z-dimension) of the transducer is typically about 0.1–1000 mm, depending on the application for which the transducer is designed. The method described herein makes possible the net-shape molding of a transducer having several thousand, e.g., about 10,000 thin layers, each being, e.g., as thin as about 20 μm. Cavities 4a and 4b define the thickness of the electrode layers in the finished transducer, typically 20–500 μm.

If desired, the outer dimensions, i.e., width W and length L of sintered blank 1 may be molded slightly oversize so that the width and length may be modified after sintering shrinkage and electroding to fine-tune the device to a preselected resonance mode. Also if desired, length L of sintered blank 1 may be sufficiently large to provide two or more individual devices, the blank being separated at a bridge 3a or 3b before or after the electroding and/or poling steps described below. Also conveniently, blank 1 may be of sufficient width W to provide two or more devices, the individual devices being separated from one another at a later stage in the fabrication process, as described below.

The ceramic blank shown in FIG. 1 is net-shape molded by any of the techniques described in above-referenced U.S. Application Ser. No. 08/686,496. For example, blank 1 may be fabricated by injection molding a hot PZT-binder mixture into a chilled, closed mold, the mold being cooled to a temperature sufficient to solidify the mixture, then ejected from the mold. The mold halves each have a number of longitudinal blade inserts projecting into the mold cavity to shape cavities 4a and 4b. This molding method is performed in a manner similar to that described for injection molding of ceramic bodies in U.S. Pat. No. 5,340,510, incorporated herein by reference.

Alternatively, the blank may be compression molded by placing a green ceramic preform between upper and lower mold halves of a heated compression molding apparatus. The preform is fabricated using a mixture of a PZT ceramic powder and a thermoplastic organic binder, e.g., a wax. The molding temperature should be slightly greater than the softening temperature of the PZT-binder mixture. As the heated mold halves are brought together with pressure sufficient to deform the preform at the selected mold temperature, the heated blade inserts penetrate into the ceramic preform. The displaced material of the preform flows into the mold cavity between the blade inserts forming a green ceramic blank. The blade inserts are disposed to alternate within the closed mold to shape the blank as a serpentine, multilayered green body. The green body and mold are cooled, and the blank is ejected from the mold.

In yet another forming process, the serpentine cross-section green body is made by forcing soft, heated thermoplastic PZT-binder mixture under pressure through a heated die in the form of a negative of the desired serpentine shape. For certain configurations of the serpentine blank, particularly for blanks having ceramic layers near the lower end of the thickness range mentioned above, a series of multiple extrusion process steps may be performed to gradually reduce the cross-section of the extruded serpentine blank to the desired fine dimensions. In a similar process, the green body is made by passing the soft, heated thermoplastic PZT-binder mixture between heated rollers shaped to form the desired serpentine cross-section green body. Similarly to the die extruded green body, multiple process steps may be required to achieve a blank of the desired fine dimensions. Other piezoelectric ceramic materials, as described above, may also be used in any of the above-described methods.

In any of these methods, the binder is removed from the blank by slow heating in a conventional manner, and the part is sintered to form densified, rigid, monolithic blank 1 described above, then prepared for use as a linear actuator by poling and electroding (using conventional methods) for linear expansion. As used herein, the terms "linear" and "linear expansion" are intended to refer to expansion of the actuator in the length, or L, direction (as described above and shown in FIG. 1). Although a serpentine ceramic body may be fabricated by machining and dicing of a sintered or green ceramic block, or other conventional method, the molding methods described above are greatly preferred, because of the reproducibility of the methods, the minute size of the net-shape ceramic bodies which may be made thereby, and the lower manufacturing cost.

Four types of serpentine linear actuators in accordance with the invention are illustrated in FIGS. 2–5. The various poling and electrode configurations allow for tailoring of the force/displacement characteristics of the devices.

Figure 2:
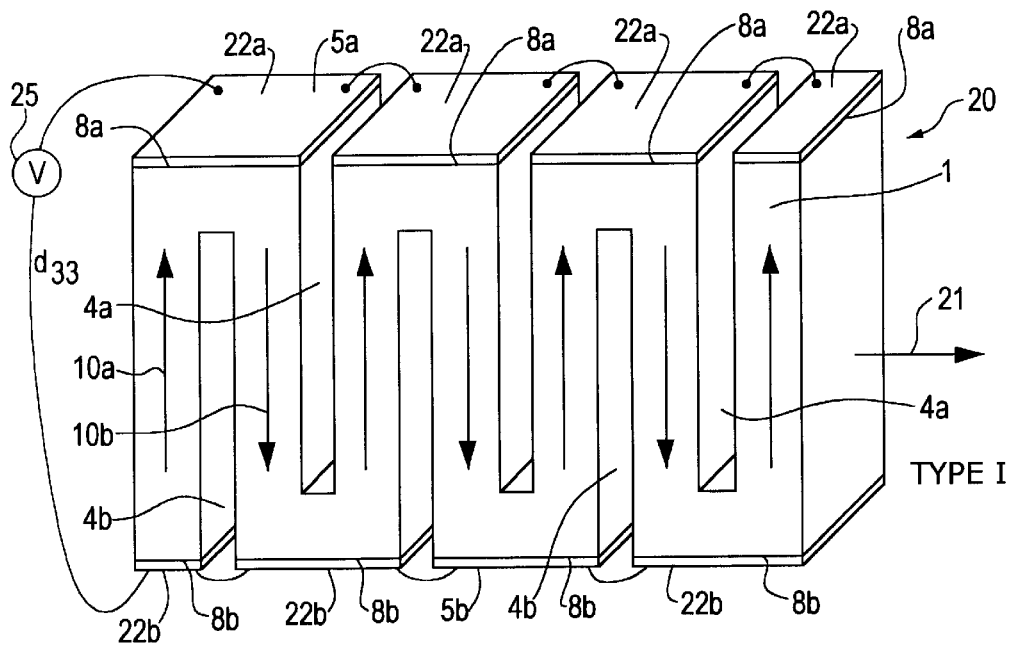
FIGS. 2, 3, 4, and 5 are schematic perspective views of piezoelectric serpentine actuators in accordance with four different embodiments of the present invention.

FIG. 2 illustrates a first type (Type I) of serpentine actuator, actuator 20, poled and electroded as shown in FIG.

2 to operate in a first $d_{33}$ configuration. Sintered serpentine blank 1 is poled in known manner, e.g., by using temporary electrodes, with the poling directions alternating in successive layers as indicated by arrows 10a and 10b. Permanent electrodes 22a are applied to surfaces 8a of side 5a of the poled ceramic body, and permanent electrodes 22b are applied to surfaces 8b of side 5b. Electrodes 22a and 22b cover only surfaces 8a and 8b, and do not extend into cavities 4a and 4b. Electrodes 22a and 22b are applied by conventional means, e.g., by abrading or stripping surfaces 5a and 5b to remove temporary electrodes then applying permanent electrodes 22a and 22b by masking non-coated surfaces and electroless plating with, e.g., nickel. Alternatively, the electrodes may be, e.g., vapor deposited or sputtered, e.g., with chrome-gold, or may be provided by fired silver frit or conductive polymers. Thus, actuator 20 is provided with separate electrodes 22a and 22b, electrically isolated from one another. The poling directions and electrode placement are selected to provide a $d_{33}$ configuration for operation of the actuator. The electrodes are then interconnected to a source of electrical power, as 25, for activation of the device, driving the device across its height with displacement and force applied in the direction shown by arrow 21.

Figure 3:
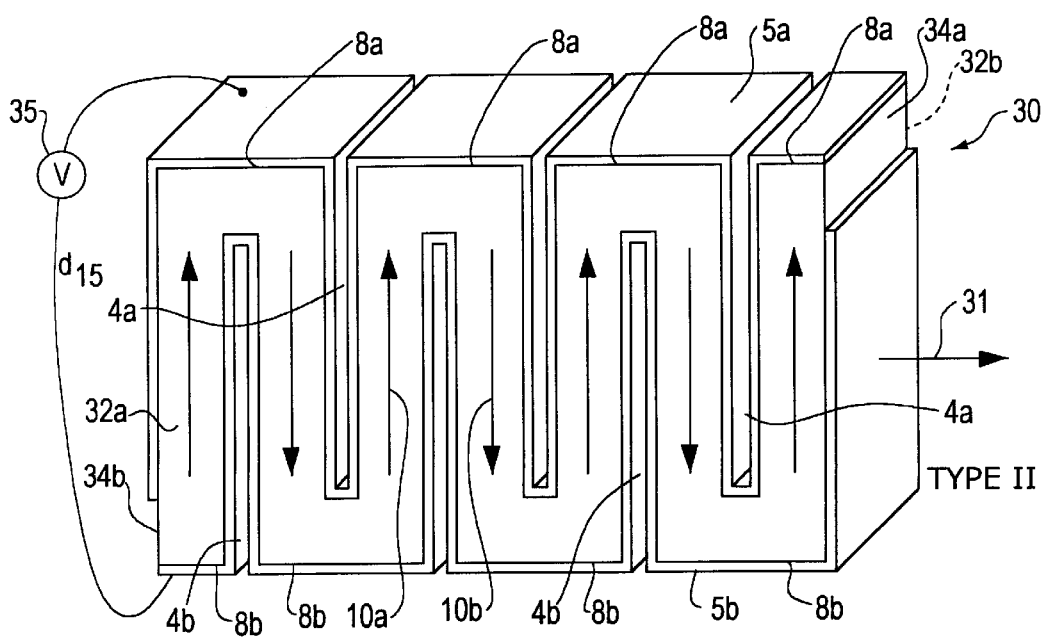

FIG. 3 illustrates a second type (Type II) of serpentine linear actuator, actuator 30 poled and electroded as shown in FIG. 3 to operate in a $d_{15}$ configuration. Sintered serpentine actuator 30 is poled in known manner, e.g., by using temporary electrodes, poling all of the layers in the direction indicated by arrows 10, i.e., all of the layers are poled in the same direction. Permanent electrode 32a is applied to surfaces 8a of side 6a of the poled ceramic body and extend into cavities 4a to cover the entire surfaces of each cavity 4a. Permanent electrode 32b is applied to the surfaces 8b of side 5b and extend into cavities 4b to cover the entire surfaces of each cavity 4b. Electrodes 32a and 32b are applied as described above for electrodes 22a and 22b. Gaps 34a and 34b separate electrodes 32a and 32b, electrically isolating the electrodes from one another. The poling directions and electrode placement are selected to provide a $d_{15}$ configuration for operation of the actuator. The electrodes are then interconnected to a source of electrical power, as 35, for activation of the device, driving the device across its layer thickness with displacement and force applied in the direction shown by arrow 31.

Figure 4:
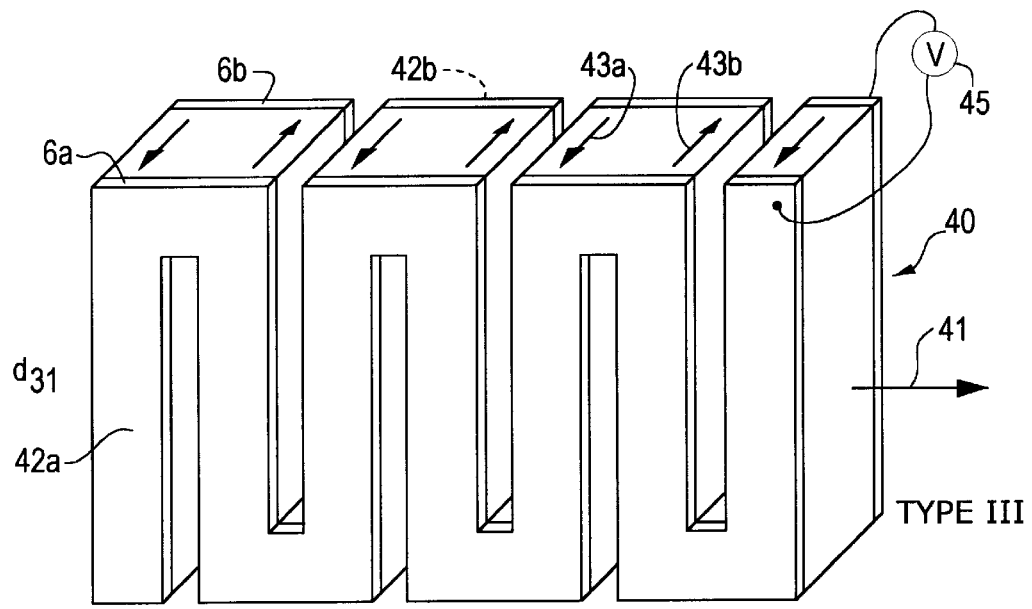

FIG. 4 illustrates a third type (Type III) of serpentine linear actuator, actuator 40, poled and electroded as shown in FIG. 4 to operate in a $d_{31}$ configuration. Sintered serpentine blank 1 is poled in known manner, e.g., by using temporary electrodes, with the poling directions alternating in successive layers as indicated by arrows 43a and 43b. Permanent electrode 42a is applied to the entire surface of side 6a of the poled ceramic body, and permanent electrode 42b is applied to the entire surface of side 6b. Electrodes 42a and 42b cover only the surfaces of sides 6a and 6b, and do not extend into cavities 4a and 4b. Electrodes 42a and 42b are applied as described above for electrodes 22a and 22b. Thus, actuator 40 is provided with separate electrodes 42a and 42b, electrically isolated from one another. The poling directions and electrode placement are selected to provide a $d_{31}$ configuration for operation of the actuator. The electrodes are then interconnected to a source, as 45, of electrical power for activation of the device, driving the device across its width with displacement and force applied in the direction shown by arrow 41.

Figure 5:
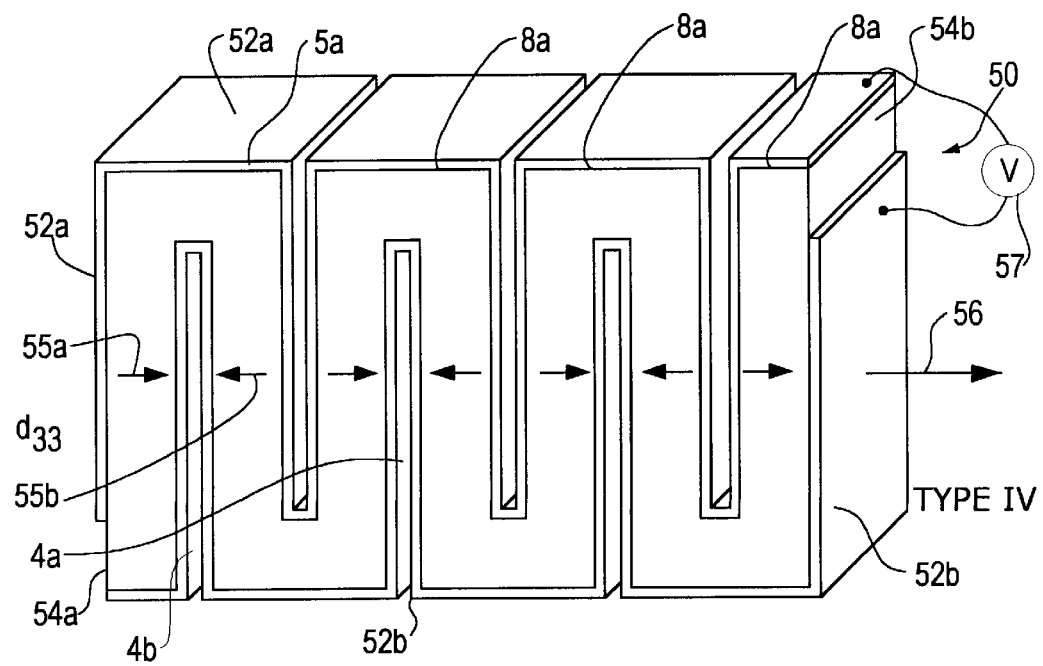

FIG. 5 illustrates a fourth type (Type IV) of serpentine linear actuator, actuator 50, poled and electroded as shown in FIG. 5 to operate in a second $d_{33}$ configuration, different from that of actuator 20. Sintered serpentine blank 1 is poled in known manner, e.g., by using temporary electrodes, with the poling directions alternating in successive layers as indicated by arrows 55a and 55b. Permanent electrode 52a is applied to surfaces 8a of side 5a and extends into cavities 4a to cover all surfaces of each cavity 4a. Permanent electrode 52b is applied to surfaces 8b of side 5b and extends into cavities 4b to cover all surfaces of each cavity 4b. Electrodes 52a and 52b are applied as described above for electrodes 22a and 22b. Gaps 54a and 54b separate electrodes 52a and 52b, electrically isolating the electrodes from one another. If desired, poling can be accomplished using permanent electrodes 52a and 52b, since the configuration of these electrodes will produce the desired poling arrangement. However the poling is effected, the poling directions and electrode placement are selected to provide a $d_{33}$ configuration for operation of the actuator. The electrodes are then interconnected to a source, as 57, of electrical power for activation of the device, driving the device in the length direction across each ceramic layer thickness with displacement and force applied in the direction shown by arrow 56.

In operation, serpentine linear actuators 20, 30, 40, and 50 as shown with open cavities in FIGS. 2, 3, 4, and 5, respectively, act as high compliance springs. A force of about 0.2–20 MPa and strain of about 0.1–2% are typical of these spring-type linear actuators. The dimensions and thickness of layers 2 and cavities 4a and 4b of blank 1 may be selected to adjust the spring constant of the elements. These actuators exhibit a high displacement/voltage ratio. In these actuators, the ends of oppositely poled piezoelectric element (layer) pairs are joined by stiff ceramic bridges. The stiffness of the actuator can be tailored by adjusting the interpenetration of cavities 4a and 4b to vary the thickness of the ceramic bridges and thereby vary the stiffness of the actuator.

The Type IV actuator, actuator 50 can be operated with open cavities 4a and 4b, as shown in FIG. 5, in a manner similar to that shown for actuators 20, 30, and 40 in FIGS. 2, 3, and 4, respectively. Normally, however, cavities 4a and 4b of a Type IV actuator would be filled with a material of lower stiffness than the ceramic of the body, e.g., polymer or metal, as described further below, to provide support and increase the force output of the device. Cavities 4a and 4b of Type I, II, and III actuators may also be filled, if desired, with a material of lower stiffness than the ceramic of the body, as described further below.

The ceramic layers of both Type I actuator 20 (FIG. 2) and Type III actuator 40 (FIG. 4) become a series of low voltage stiff benders in which the total actuator strain is the sum of the displacements from each pair. Type I actuator 20 is configured to operate in a slightly lower force/higher displacement regime than Type IV actuator 50 (FIG. 5). Type III actuator 40 requires only a low voltage for operation, and its displacement performance is enhanced by its length-to-thickness amplification.

Type II actuator 30 (FIG. 3) generates bending in each layer by clamping of the mechanical $d_{15}$ shear stress between elements (layers) by attachment of each element to elements on either side. The total displacement is the sum of these bending moments. This actuator requires only a low drive voltage and can be configured to operate in a moderate force/moderate displacement regime because of its high piezoelectric coefficient and low stiffness.

Type IV actuator 50 (FIG. 5) exhibits a higher force/displacement ratio than actuators 20, 30, and 40. Each ceramic layer of actuator 50 is subjected to a high electric field to yield strain levels perpendicular to the layers of up to about 0.1%. Additionally, cavities 4a and 4b open due to the bending at bridges 3a and 3b to increase overall strain levels of the device up to about 2%.

In each of the Type I, II, III, and IV actuators, e.g., actuators 20, 30, 40, and 50, respectively, the thickness of ceramic layers 2, the thickness of cavities 4a and 4b, and the material filling the cavities (as described below) may be selected to adjust the required voltage/current and the force/displacement ratios to a particular application.

Any of the Type I, II, III, or IV actuator configurations described herein may be fabricated as thin sheets, with a height H of 1 mm or less, e.g., as small as about 0.5 mm, and a large width W and length L, e.g. up to W=100 mm and L=1000 mm. These sheet actuators may be applied as surface mounted (patch) devices or as embedded devices for, e.g., vibration damping. Such sheet actuators are conformable to curved surfaces, and may be configured for unidirectional actuation, since the height and width components of the displacement are not significant in proportion to the length component. Using the Type IV configuration of actuator 50, for example, the sheet actuator can exhibit higher displacement and higher force than prior art $d_{31}$ monolithic PZT plates.

Figure 6A:
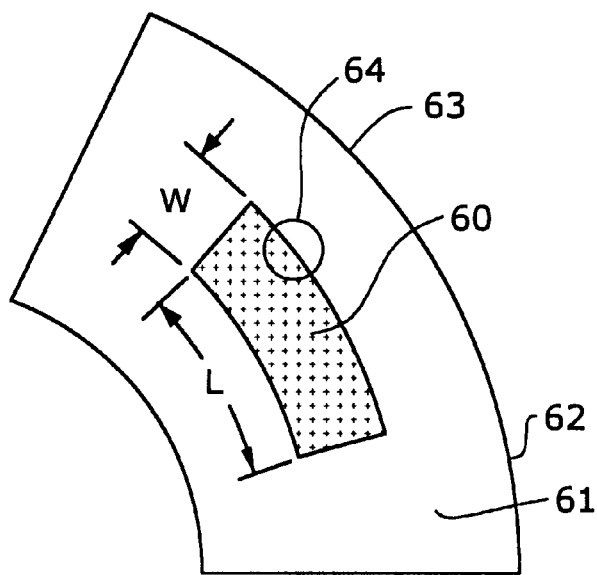
FIGS. 6A and 6B are schematic elevation and cross-sectional perspective views, respectively, of a surface mounted sheet actuator in accordance with another embodiment of the invention.
Figure 6B:
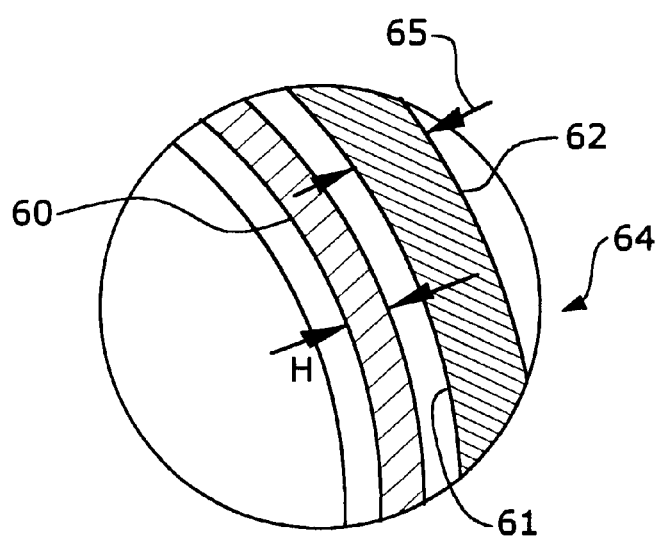

FIGS. 6A and 6B illustrate a typical Type IV sheetform $d_{33}$ actuator configured as shown in FIG. 5 for actuator 50, mounted on a vibrating structure, e.g., an aircraft fuselage inside surface. As shown in FIG. 6A, unidirectional operating Type IV sheet actuator 60 of width W and length L is mounted on surface 61 of vibrating structure 62. Portion 64, shown in detailed cross-sectional view in FIG. 6B, includes actuator 60, surface 61, and structure 62. Activation of sheet actuator 60 expands the actuator in the direction of length L, allowing for detection and control of unacceptable vibration in the fuselage. A similar device and mounting may be fabricated, using Type I, II, III, or IV serpentine actuator configurations, for other applications, e.g., to suppress noise and vibration in an aircraft cabin, transformer housing, air duct, or other vibration-prone equipment or noisy environment.

Figure 7A:
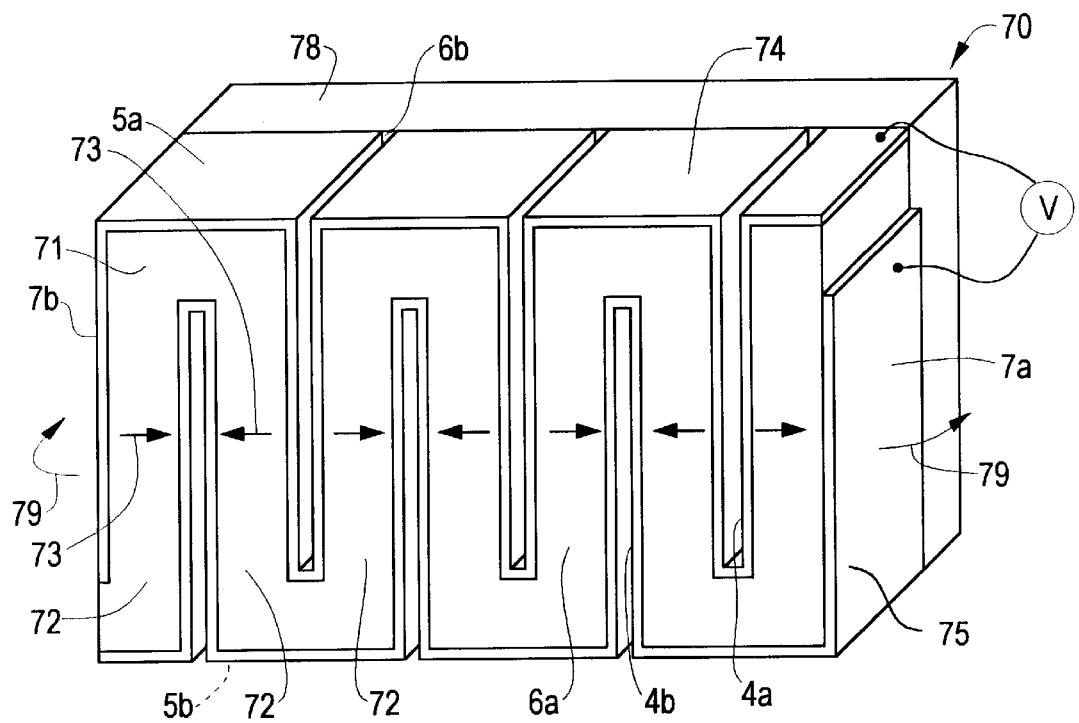
FIGS. 7A, 7B, 8A, 8B, and 9 are schematic perspective views of actuators in accordance with other embodiments of the invention.

Other Type I, II, III, or IV actuators may be fabricated from the net-shape molded serpentine ceramic blank of FIG. 1, or configurations similar to that shown in FIG. 1. For example, FIG. 7A illustrates actuator 70 configured as a Type IV actuator. Actuator 70 includes serpentine piezoelectric ceramic body 71 having side surfaces 5a and 5b, side surfaces 6a and 6b, end surfaces 7a and 7b, and cavities 4a and 4b, similarly to blank 1 of FIG. 1. Body 71 is poled through the ceramic layer thickness dimension of parallel ceramic layers 72, as shown by arrows 73, and electrodes 74 and 75 are bonded to the ceramic body for actuation of the device as a Type IV linear actuator. Side plate 78 of, e.g., stiff metal, stiff polymer, or ceramic is bonded to side surface 6b of body 71 by a suitable adhesive material such as an epoxy material or by glass frit, soldering, brazing, or direct thermo-bonding under heat and pressure. Examples of suitable plate materials are metals such as Invar nickel alloy, aluminum, brass, or steel, or polymers such as a polyimide, polyurethane, or fiber-reinforced epoxy material. If plate 78 is metal or other conductor, a thin, non-conductive layer (not shown) of, e.g., a polyimide electrically isolates the plate from at least one electrode. On activation, ceramic body 71 expands in the length direction similarly to the expansion shown for actuator 50 of FIG. 5. However, side 6b of body 71 adjacent to plate 78 is constrained by the plate, permitting expansion only in the ceramic body portions opposite plate 78 causing bending of the device in the direction of arrows 79. In the embodiment shown in FIG. 7A, side plate 78 is bonded to side surface 6b. Alternatively, depending on the application for which the device is fabricated, plate 78 may be bonded to side 5a or 5b. In this instance, the bending would also be in the direction of the plate due to the expansion of side 5a or 5b opposite to the bonded side.

Figure 7B:
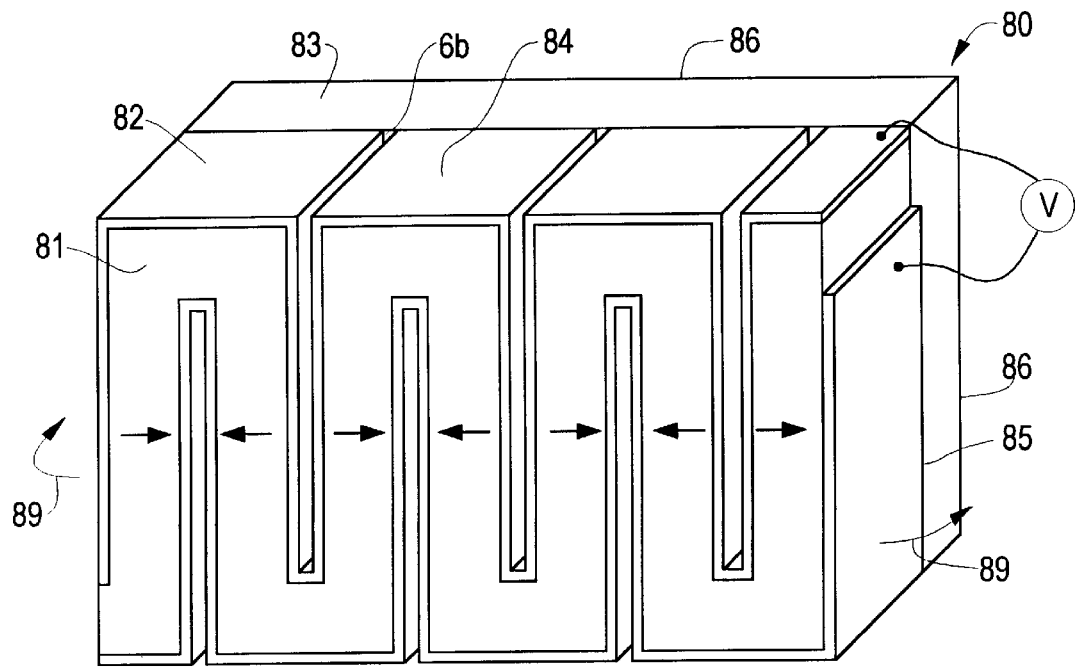

Type IV actuator 80 of FIG. 7B is similar to actuator 70 of FIG. 7A, and operates in a similar manner. Piezoelectric ceramic body 81 includes serpentine portion 82 and solid portion 83. Body 81 is poled across the thickness of the ceramic layers and electrodes 84 and 85 applied in the same manner as is described above for actuator 70. Alternatively, electrodes 84 and 85 may extend across solid portion 83 to edges 86 of the solid portion. On activation of the device, solid portion 83 serves the same function as side plate 78 of actuator 70, constraining side 6b of serpentine portion 82 adjacent to solid portion 83. Thus, activation of Type IV actuator 80 causes bending of the device in the direction of arrows 89. Similarly to the actuator 70 including plate 78, constraint may be effected in actuator 80 at a different side of serpentine portion 82 than that illustrated in FIG. 7B.

In alternating embodiments of the actuators of FIGS. 7A and 7B, the actuators each include a second sepentine portion on the side of the plate or poled portion opposite the serpentine portion described above. The serpentine portions on opposite sides of the plate or solid portion are activated to expand alternately, resulting in a Bimorph-type bending action.

Although actuators 70 and 80 are shown as Type IV actuators, either may be poled and electroded to operate as a Type I, II, or III actuator, depending on the application and the actuator characteristics required.

Figure 8A:
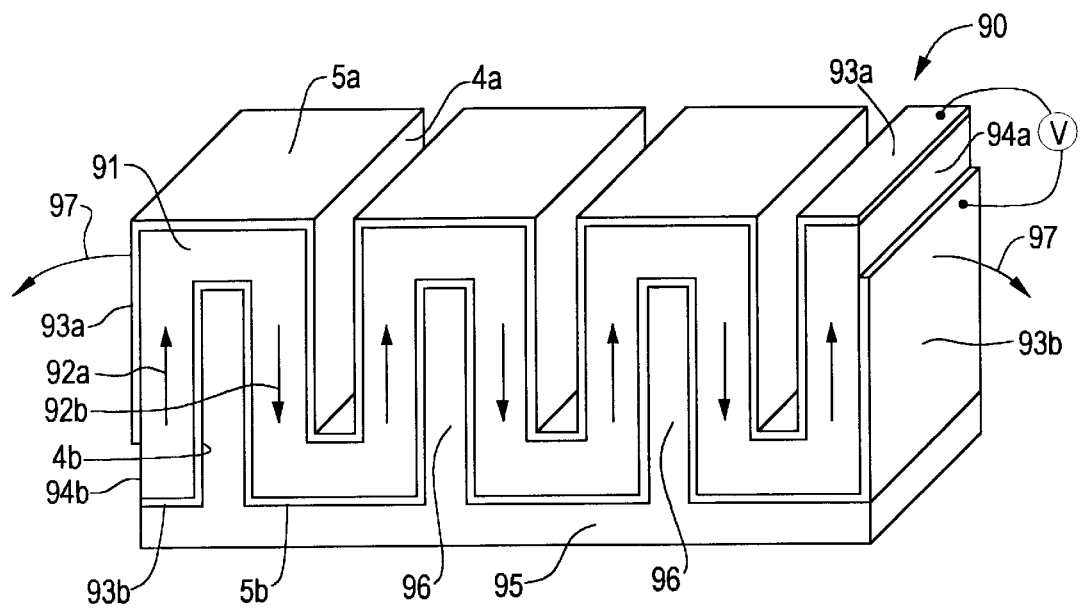
Figure 8B:
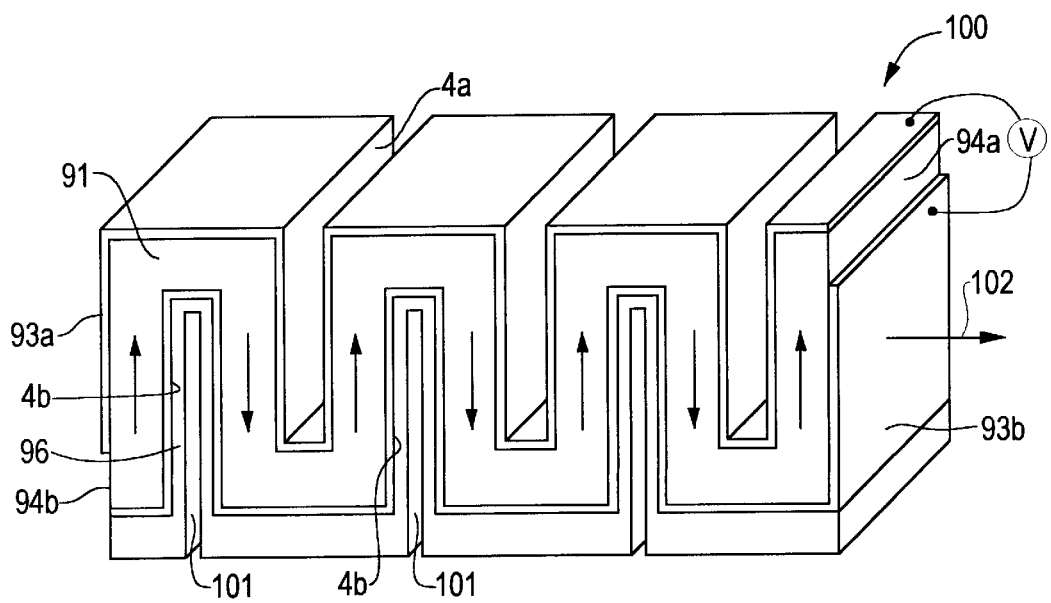

FIGS. 8A and 8B illustrate other alternative actuator configurations. FIG. 8A shows actuator 90 including piezoelectric ceramic body 91. Body 91 is poled and electroded to operate as a Type II actuator with the poling directions of each layer as indicated by arrows 92a and 92b. Electrodes 93a and 93b are applied to ceramic body 91 by plating or coating the surfaces with nickel or other electrically conducting material by conventional techniques, as described above for actuator 30. Electrode 93a extends continuously over surfaces 5a and 7a and within cavities 4a, while electrode 93b extends continuously over surfaces 5b and 7b and within cavities 4b. Electrodes 93a and 93b are electrically isolated from one another by gaps 94a and 94b. Side plate 95 is bonded to body 91 via electrode 93b, and includes protrusions 96 extending into, filling, and bonded to gaps 4b. Side plate 95 may be a polymer or metal material, e.g., an epoxy or filled epoxy material, polyurethane, brass, or steel. Side plate 95 may be fabricated by partial encapsulation of the plated ceramic body, or cavities 4b may be filled to form the protrusions and a separate plate bonded to the protrusions and the plated ceramic body. Alternatively, cavities 4a and 4b may be filled by permitting the adhesive to flow into and fill the cavities. In any of these embodiments, the protrusions are of a material of lower stiffness than the ceramic of the body. Constraint of one side of actuator 90 by side plate 95 during activation of the device causes bending of the device in the direction shown by arrows 97.

Another alternate device, which may be derived from Type II actuator 90, is shown in FIG. 8B. Type II actuator 100 includes piezoelectric ceramic body 91, electrodes 93a and 93b, and, e.g., metal or polymer side plate 95, as described above. However, protrusions 96 of plate 95 have been shaped, e.g., by machining, casting, molding, spraying, plating, or other similar means to include cavities 101 extending into and parallel to cavities 4b. Activation of actuator 100 causes expansion of the device in the direction shown by arrow 102, but with a slight degree of bending dependent on the material used to form the protrusions.

Although actuators 90 and 100 are shown as Type II actuators, either may be poled and electroded to operate as a Type I, III, or IV actuator, depending on the application and the actuator characteristics required.

Figure 9:
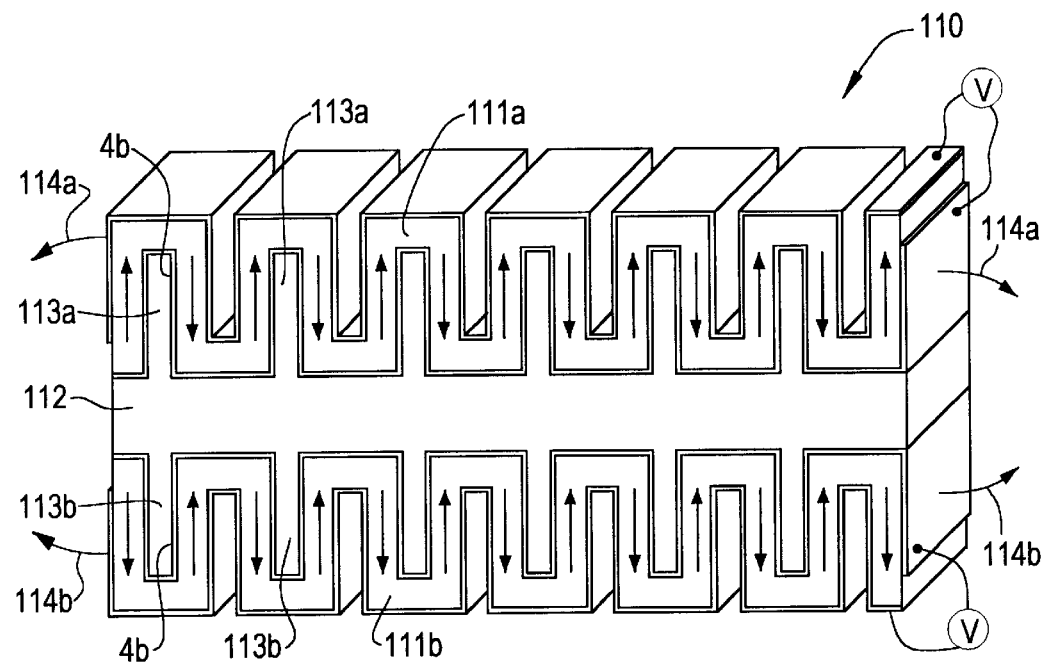

Type II actuator 110, fabricated in a similar manner to actuator 90, is shown in FIG. 9. Actuator 110 includes a pair of electroded piezoelectric bodies, 111a and 111b which are each poled and electroded to operate as a Type II bender, as shown and described for ceramic body 91 of actuator 90, and are mirror images of one another. Piezoelectric ceramic bodies 111a and 111b are operated so that one expands while the other contracts upon applying voltages of suitable polarity to each, thereby causing bending of the device in the direction shown by arrows 114a and 114b. Bodies 111a and 111b are joined by central plate 112, which is bonded to each ceramic body. Central plate 112 optionally includes protrusions 113a and 113b which extend into and fill cavities 4b of each body. Alternatively, plate 112 and, optionally, protrusions 113a and 113b may be provided by an adhesive which also directly joins bodies 111a and 111b.

Although actuator 110 is shown as a Type II actuator, it may be poled and electroded to operate as a Type I, III, or IV actuator, depending on the application and the actuator characteristics required.

Figure 10:
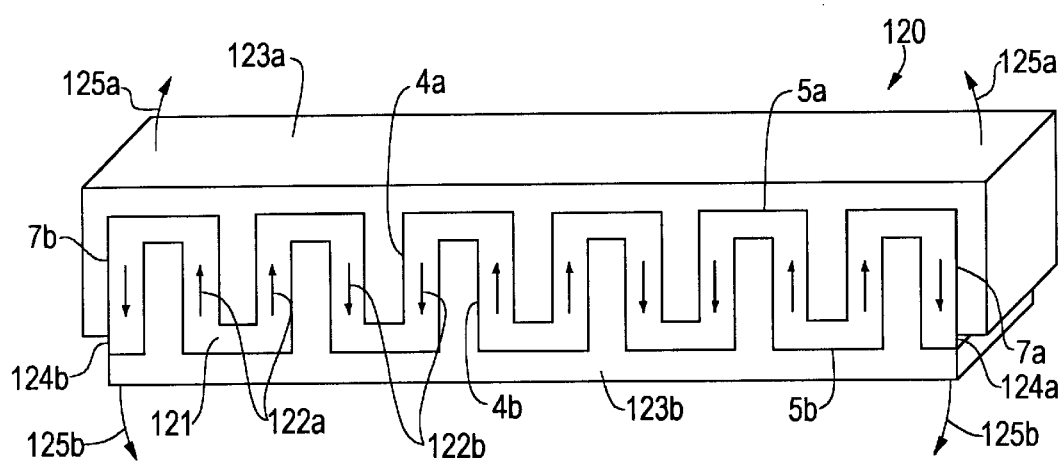
FIGS. 10, 11, 12, 13A and 13B are schematic perspective views of actuators in accordance with still other embodiments of the invention.

Most of the above serpentine actuators, i.e., actuators 20, 30, 40, and 50 and their derivatives, actuators 60, 70, 80 and 100, are shown with void spaces in cavities 4a and 4b. Actuators 90 and 110 have void spaces in cavities 4a. Alternatively, cavity void spaces in any of the actuators described herein may be filled with a conductive or non-conductive filler to strengthen and tune the force/displacement ratio of the serpentine actuator. For example, FIG. 10 illustrates Type IV actuator 50a, which includes Type IV actuator 50, as described above, and also includes filler portions 58a and 58b of a conductive material, e.g., a silver-epoxy material, filling cavities 4a and 4b. The filler material is less stiff, more flexible, and more compressible than the ceramic material of the body. Alternatively, even more flexible, e.g., elastomeric materials may be used as the filler material of filler portions 58a and 58b. For example, a polyurethane or rubber may be used as a flexible filler, or the polyurethane or rubber may be admixed with polymer microballons to render the filler still more flexible. Also alternatively, the cavities may be filled with a rigid material such as a metal or conductive glass frit; however, the filler must be less rigid than the ceramic of the body. If the filler is conductive, coating the surfaces of cavities 4a and 4b with a conductive coating, as described above, is optional.

Although actuator 50a is shown as a Type IV actuator, it may be poled and electroded to operate as a Type I, II, or III actuator, depending on the application and the actuator characteristics required.

Figure 11:
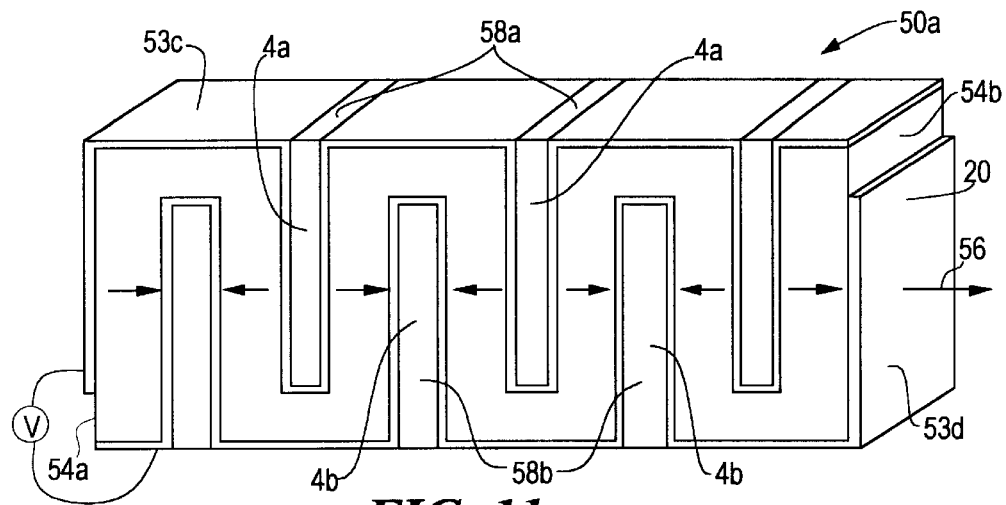

An alternative geometry for the serpentine ceramic body of a serpentine actuator as described herein is illustrated in FIG. 11. Serpentine actuator 130 includes ceramic body 131 and electrodes 132a and 132b. Ceramic body 131 includes bridges 133a and 133b which are narrower than bridges 3a and 3b of actuator 30 shown in FIG. 3. Ceramic body 131 also includes ceramic layers 134a and 134b which are not parallel to one another. Actuator 130 is poled and electroded to operate as a simple Type II actuator similar to that shown in FIG. 3. However, it may be poled and electroded to operate as a Type I, III, or IV actuator, and may be adapted as described for any of the actuators of FIGS. 6A through 10, depending on the application and the actuator characteristics required.

Also alternatively, any of the above-described actuators may be made more robust by providing chamfered or radiused inner and outer edges at the ceramic bridges joining the layers. FIG. 12 illustrates Type III actuator 40a including ceramic body 44, as described above, having layers 2a and 2b and bridges 3a and 3b. Outer edges 45a and inner edges 45c of bridges 3a, respectively and outer edges 45c and inner edges 45d of bridges 3b are radiused to avoid stress cracking between the ceramic layers and bridges during activation. The chamfering or radiusing of the bridge edges may be molded into the ceramic blank or may be effected by machining in known manner.

Figure 12A:
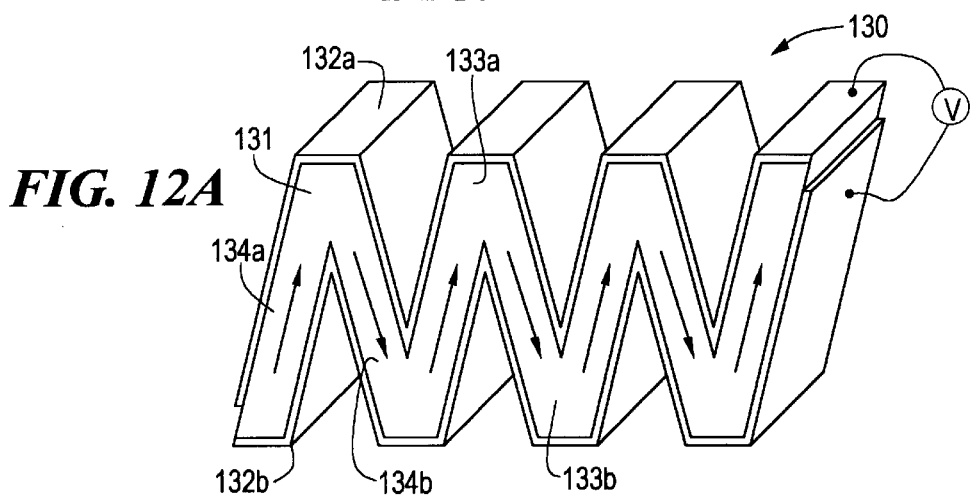
Figure 12B:
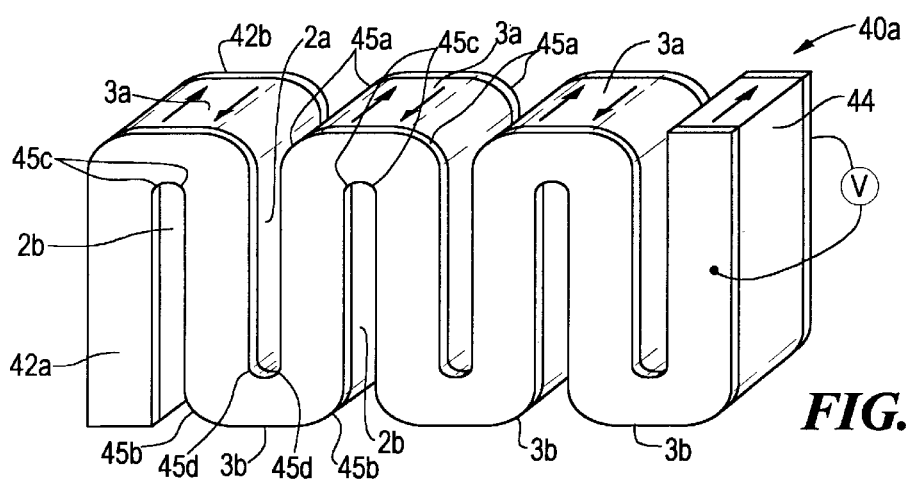

Although actuator 40a is shown as a Type III actuator, it may be poled and electroded to operate as a Type I, II, or IV actuator, or to have ceramic layers at an angle to one another as shown in FIG. 12A, depending on the application and the actuator characteristics required.

Figure 13A:
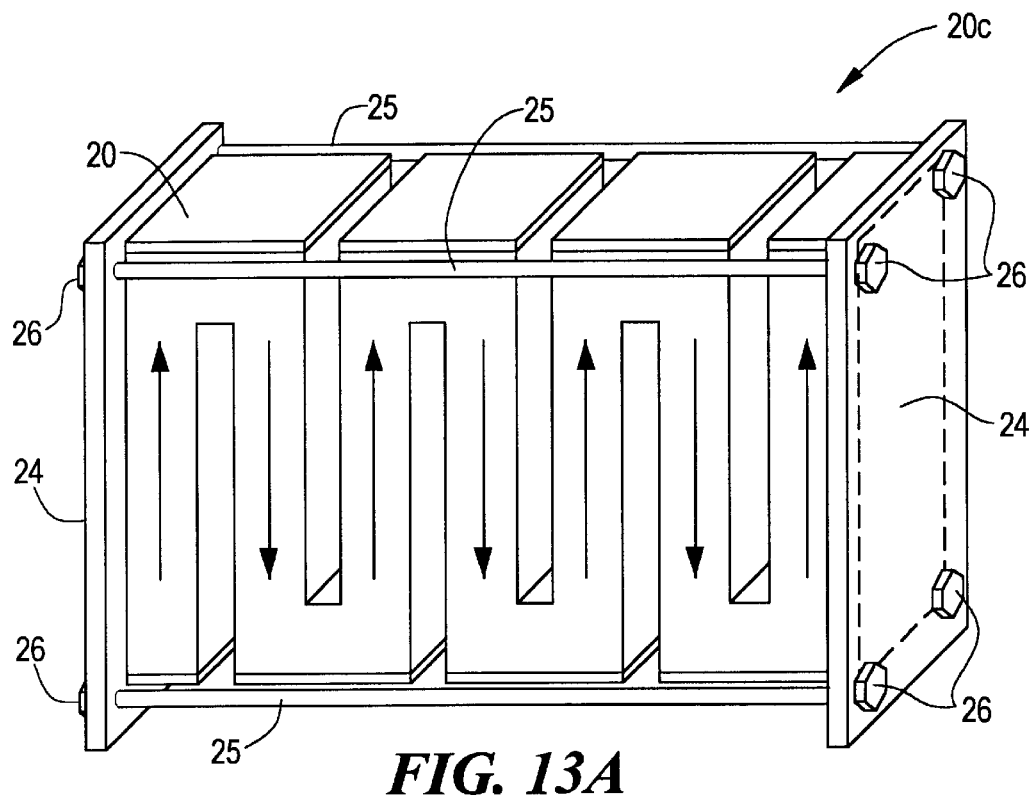
Figure 13B:
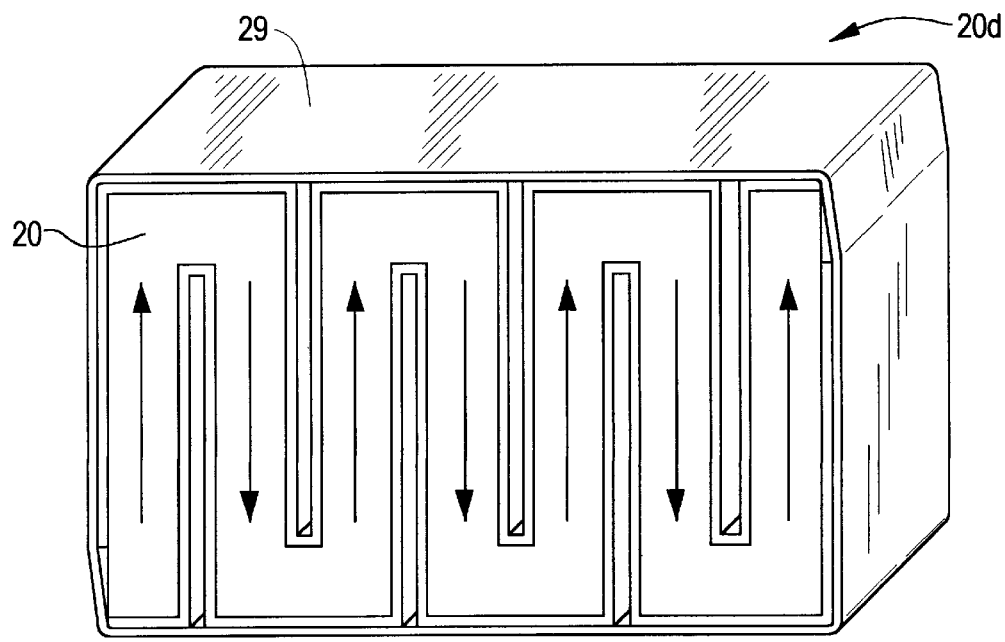
Figure 14:
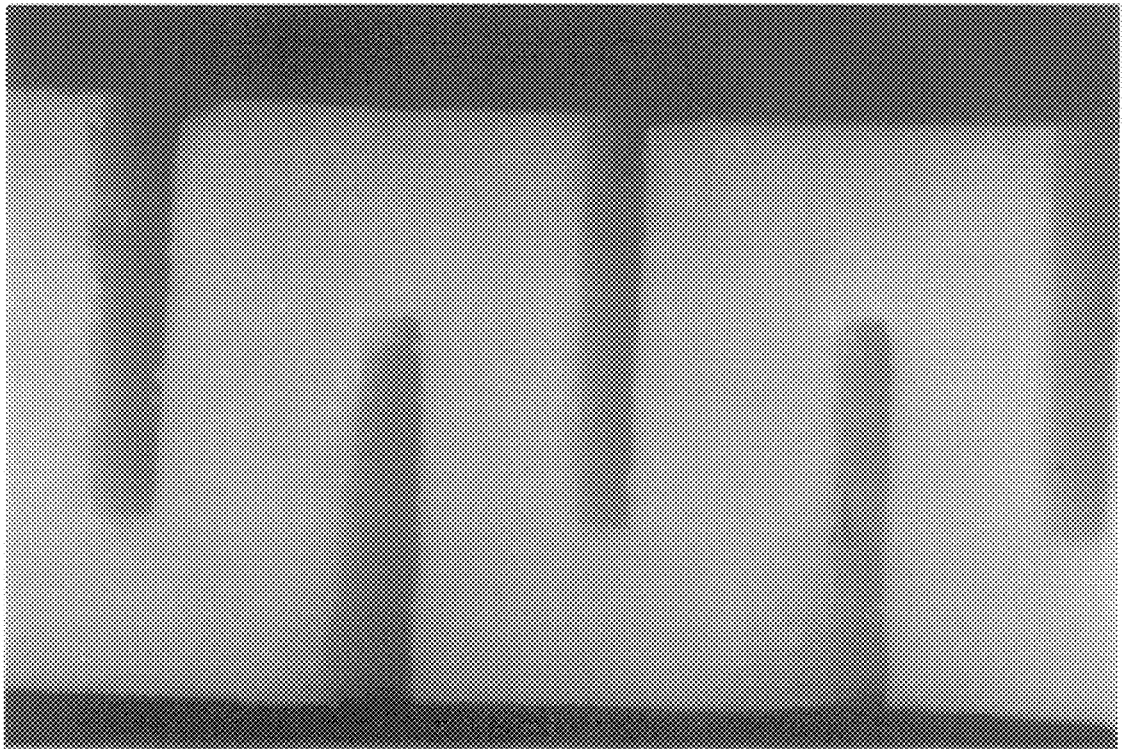
FIGS. 14, 15, 16, and 17 are photomicrographs showing sheet actuators of different geometries.
Figure 15:
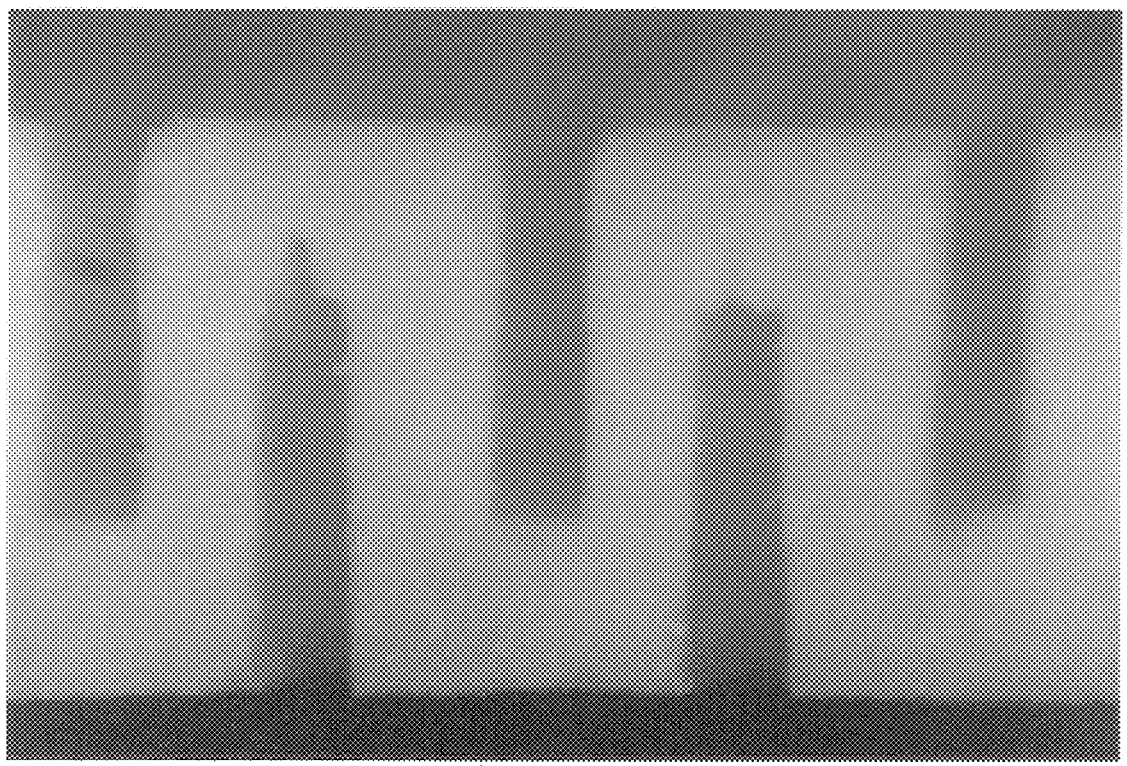
Figure 16:
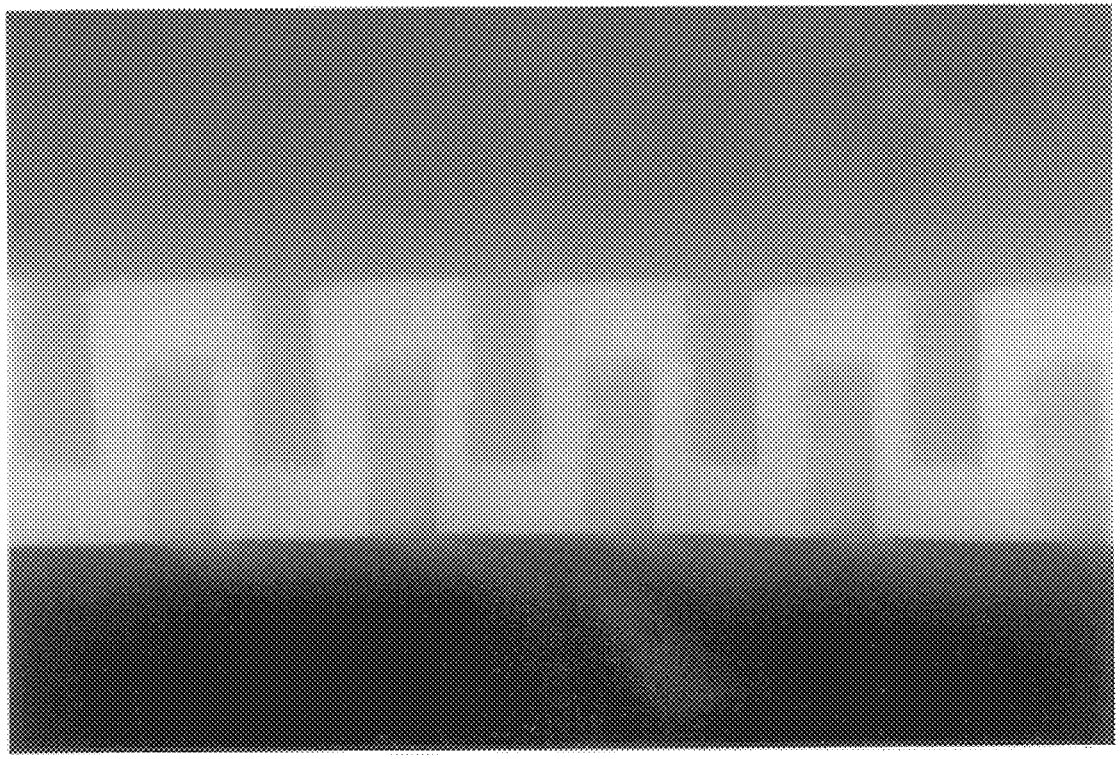
Figure 17:
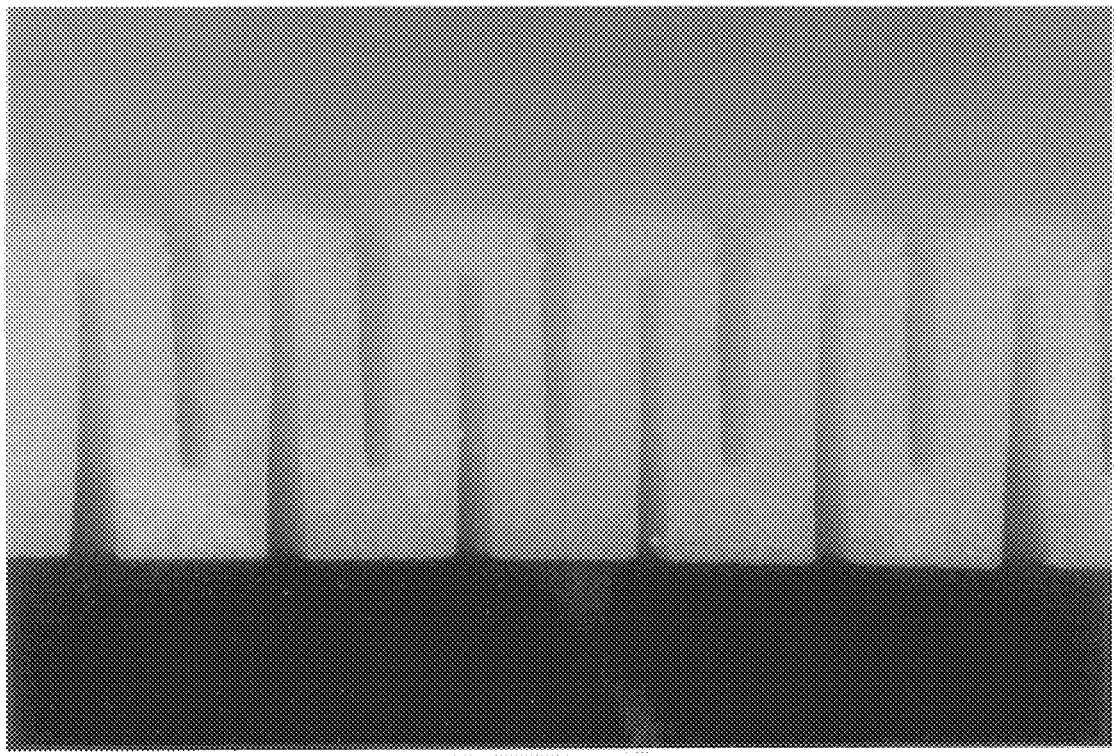

Another way to add to the robustness of the serpentine actuators described herein is to apply compression to the actuators in the direction of displacement during fabrication. Such a devices are illustrated in FIGS. 13A and 13B. FIG. 13A illustrates compressed actuator 20b, which includes actuator 20, as described above, and also includes end plates 24, threaded rods 25, and cap nuts 26. End plates 24 each include a bore at each corner through which threaded rods 25 extend. Alternatively, actuator 20 may be notched or otherwise shaped to accomodate rods 25. The degree of compression on actuator 20b may be adjusted by tightening or loosening nuts 26 on rods 25. The plates, rods, and nuts are preferably of a metal such as steel, brass, or titanium, but may be of any suitable material known in the art.

FIG. 13B illustrates an alternate way of compressing the actuators. Actuator 30b includes actuator 30, as described above, and fiberglass wrap 34. Other suitable materials for the wrap include carbon fiber, epoxy, polyimide, polyurethane, or electrically insulated metal wire or foil. Wrap 34 is applied during fabrication of the actuator, and holds actuator 30 in compression. Compression may be applied, e.g., using a heat-shrink polymer in the wrap or by holding the actuator in compression with tooling while the wrap is applied. Also alternatively, other shrinkable materials, e.g., shrinkable coatings, may be used to apply compression to the device to increase the strength and resiliancy of the actuator.

Although actuators 20c and 30b are shown as Type I and Type II actuators, respectively, either may be poled and electroded to operate as a Type I, II, III or IV actuator, or to have ceramic layers at an angle to one another as shown in FIG. 12A, depending on the application and the actuator characteristics required.

Any of the above-described Type I, II, III, or IV serpentine actuators may be fabricated from a serpentine-type blank, as described herein, of the piezoelectric materials mentioned above. The blank may have a height of about 0.1–100 mm, a width of about 0.1–1000 mm and a length of about 0.1–1000 mm. The devices may be electroded with any of the electrically conductive materials listed above. Additionally, the actuators described herein may be encapsulated in a conductive or non-conductive material, e.g., polyurethane or an epoxy material. Larger actuation strains and forces may be obtained by assembling together two or more of the single actuators described above, so that their force and/or strain outputs are additive.

The following Examples are presented to enable those skilled in the art to more clearly understand and practice the present invention. These Examples should not be considered as a limitation upon the scope of the present invention, but merely as being illustrative and representative thereof.

EXAMPLE 1

Four Type IV sheet actuators, Samples 1–4, were prepared by net-shape compression molding of a soft piezoelectric PZT (DoE type VI) as described above, having asfired dimensions as follows:

| Length: | 8.4 mm | | | | |
|---|---|---|---|---|---|
| Width: | 12.2 mm | | | | |
| Inactive thickness (bridges): | 0.30 mm | | | | |
| As fired dimensions, $\mu$m: | | | | | |
| Samples | | 1 | 2 | 3 | 4 |
| Ceramic layer thickness | | 340 | 240 | 180 | 320 |
| Cavity thickness | | 100 | 160 | 240 | 100 |
| Pitch | | 440 | 400 | 420 | 420 |
| Height | | 1000 | 1000 | 1000 | 1675 |

The actuator pitch, ceramic layer thickness plus cavity thickness, was similar for the actuators of Samples 1–3, but the ceramic layer thickness/cavity thickness ratio was varied. Sample 4 was similar to Sample 1, but differed in the height dimension. FIGS. 14, 15, 16, and 17 illustrate the four sheet actuator electroded bodies, Samples 1, 2, 3, and 4, respectively.

Each of the actuators was poled and electroded in a Type IV configuration, as described above with reference to FIG. 11. Low cost electroless nickel permanent electrodes were applied, as described above. Electrical wires were attached to the electrodes in known manner.

Sample actuators 1, 2, and 4 were operated to evaluate the effect of device dimensions, i.e., height and ceramic/cavity thickness ratios, on compliance and actuation performance. Table I shows the results as compared to solid, monolithic PZT (DoD type VI) ceramic control sample having the same piezoelectric properties as the ceramic used to form the actuators of Samples 1, 2, and 4. In Table I, $Y^E_{33}$ is the effective Young's modulus, $s^E_{33}$ is the effective compliance, and $d_{33}$ is the effective piezoelectric constant of the solid PZT control sample and the actuators of Samples 1, 2, and 4.

TABLE I

| Sample | $Y^E_{33}$ ($10^{10}$ N/m$^2$) | $s^E_{33}$ ($10^{-12}$ m$^2$/N) | $d_{33}$ ($10^{12}$ m$^2$/V) |
|---|---|---|---|
| control | 4.80 | 20.8 | 593 |
| 1 | 1.62 | 61.6 | 1926 |
| 2 | 1.12 | 89.3 | 2633 |
| 4 | 1.57 | 63.9 | — |

EXAMPLE 2

A Type II actuator was prepared by net-shape compression molding of a soft piezoelectric PZT (DoE type VI) as described above, having as-fired dimensions as follows:

Length: about 25 mm
Width: about 25 mm
Inactive thickness (bridges): 0.30 mm
Ceramic layer thickness: 240 $\mu$m
Cavity thickness: 160 $\mu$m
Pitch: 400 $\mu$m
Height: 1000 $\mu$m The actuator was poled and electroded in a Type II, $d_{15}$ configuration with the poling of all layers being in the same direction. Low cost electroless nickel permanent electrodes were applied, as described above. Electrical wires were attached to the electrodes in known manner. The actuator was encapsulated in a weatherable epoxy encapsulant. The actuator was operated at 140 Vpp (Volts peak-to-peak) at 80 Hz, and compared to (a) a ½ inch length, $d_{33}$ configured multilayer actuator of similar materials and having the same piezoelectric properties as the ceramic used to form the Type II actuator, and (b) a $d_{33}$ configured Type IV serpentine actuator as described in Application Ser. No. 08/901,038. The control samples had longitudinal displacements, of (a) 164 $\mu$in. and (b) 400 $\mu$in., respectively, per ½ inch of length, while the Type II actuator sample had a longitudinal displacement of 675 $\mu$in per ½ inch of length.

EXAMPLE 3

Three samples of a Type II patch (or sheet) actuator, Samples 1–3, were prepared by net-shape compression molding of a soft piezoelectric PZT (DoE type VI) as described above, having as-fired dimensions as follows:

Length: about 25 mm
Width: about 25 mm
Inactive thickness (bridges): 0.30 mm
Ceramic layer thickness: 240 $\mu$m
Cavity thickness: 160 $\mu$m
Pitch: 400 $\mu$m
Height: 1000 $\mu$m Each actuator was poled and electroded in a Type II, $d_{15}$ configuration with the poling of all layers being in the same direction. Low cost electroless nickel permanent electrodes were applied, as described above. Electrical wires were attached to the electrodes in known manner. The actuators were encapsulated in a weatherable epoxy encapsulant. The actuators were operated at 140 Vpp (Volts peak-to-peak) at 80 Hz, and compared to a solid, monolithic PZT (DoD Type VI) ceramic body. The control sample had a longitudinal displacement of 159 $\mu$in./in., while samples 1, 2, and 3 had longitudinal displacements of 856, 1519, and 1558 $\mu$in./in., respectively.

As may be seen from Examples 2 and 3, the Type II actuators tested exhibited a marked improvement in displacement at a given voltage over both monolithic PZT and prepared samples having a $d_{33}$ multilayer configuration, and exhibited greater displacement than even the similarly prepared Type IV actuator tested.

The invention described herein presents to the art a novel piezoelectric linear actuator having a serpentine cross-section. The actuator may be fabricated using net-shape forming processes, making possible the fabrication of a low voltage, high displacement, moderate force linear actuator. The actuator is device which may be fabricated using low cost net shape molding techniques, and exhibits advantageous force/displacement characteristics which may be tailored to many applications. The actuator is particularly useful for such applications as vibration damping, noise suppression, active surface control, actuated structures, positioning, acoustic transmitting, and acoustic signal generation.

While there has been shown and described what are at present considered the preferred embodiments of the invention, it will be apparent to those skilled in the art that modifications and changes can be made therein without departing from the scope of the present invention as defined by the appended claims.

We claim:

1. A piezoelectric linear actuator comprising:

a unitary densified, rigid, monolithic, poled piezoelectric or electrostrictive ceramic body, said body comprising a top, four sides generally normal to and interconnected with said top, a base generally normal to and interconnected with said sides, and two or more ceramic layers including a top ceramic layer providing said top, a bottom ceramic layer providing said bottom, and, optionally, one or more intermediate ceramic layers, said layers being superimposed over one another;

wherein each ceramic layer except said top ceramic layer is joined at a first of said sides to one of said ceramic layers adjacent thereto by a first ceramic bridge and each ceramic layer except said bottom ceramic layer is joined at a second of said sides opposite said first side to another of said ceramic layers adjacent thereto by a second ceramic bridge; and wherein first and second cavities extend into said ceramic body from said first and second sides, respectively, said first cavities alternating with said second cavities in said ceramic body, such that said ceramic body has a serpentine cross-section; said body further comprising a first electrode and a second electrode, each of an electrically conductive material, said first and second electrodes being disposed along and bonded to said first and second sides, respectively, of said body;

wherein said body is poled and electroded in a $d_{33}$ or $d_{15}$ configuration to effect linear expansion of said actuator in a direction normal to said ceramic layers; said first and second electrodes extend into said first and second cavities, respectively, to provide internal electrode portions for each electrode; said internal electrode portions are bonded to said ceramic layers in said first and second cavities; each of said first and second electrode portions defines an electrode cavity internal to said first and second cavities, respectively; and said first electrode internal electrode portions alternate with said second electrode portions such that each of said electrodes has a continuous serpentine cross-section.

2. A linear actuator in accordance with claim 1 wherein said ceramic body is formed from a piezoelectric or electrostrictive ceramic material selected from the group consisting of lead zirconate titanates; lead magnesium niobates; lead zinc niobates; lead nickel niobates; titanates, tungstates, zirconates, and niobates of lead, barium, bismuth, and strontium; and derivatives thereof.

3. A linear actuator in accordance with claim 1 wherein each of said internal electrode cavities is unfilled or is with a compliant material selected from the group consisting of polymer resins and rubbers of lower stiffness than said ceramic body.

4. A linear actuator in accordance with claim 1 wherein said first electrode further includes a lower electrode portion on said body base.

5. A linear actuator in accordance with claim 1 wherein said second electrode further includes upper electrode portion on said body top.

6. A linear actuator in accordance with claim 1 wherein said actuator includes a plate bonded to one side of said actuator such that, on activation, said bonded side is constrained by said plate causing said actuator to bend.

7. A linear actuator in accordance with claim 6 wherein said plate includes plate portions extending into and bonded to said second cavities of said body, said plate portions being of lower stiffness than said ceramic body.

8. A linear actuator in accordance with claim 7 wherein said plate is a polymer material cast or molded onto said actuator.

9. A linear actuator in accordance with claim 1 wherein said actuator includes two of said serpentine-shaped ceramic bodies, each having said first and second electrodes bonded thereto, one side of each body being bonded to opposing sides of a plate such that, on activation of said bodies alternately with one another, said bonded body sides being constrained by said plate, said actuator bends in alternating and oposite directions.

10. A linear actuator in accordance with claim 9 wherein said plate includes plate portions extending into and bonded to said second cavities of each of said bodies.

11. A linear actuator in accordance with claim 10 wherein said plate is a polymer material cast or molded onto said actuator.

12. A linear actuator in accordance with claim 1 wherein said actuator includes two of said serpentine-shaped ceramic bodies, each having said first and second electrodes bonded thereto, one side of each body being bonded to the same side of the other of said bodies such that, on activation tion of said bodies alternately with one another, said bonded body sides being constrained by said bonding, said actuator bends in alternating and opposite directions.

13. A linear actuator in accordance with claim 3 wherein each of said first and second internal electrode portions defines an internal cavity, and wherein said actuator includes a serpentine-shaped flexible polymeric coating bonded to and conforming to said second electrode.

14. A linear actuator in accordance with claim 1 wherein said actuator in its non-activated state is under compression in the direction of linear expansion.

15. A linear actuator in accordance with claim 1 wherein each of said bridges of said ceramic body includes chamfered or radiused edges at points of strain.

16. A piezoelectric linear actuator comprising:

a unitary densified, rigid, monolithic, poled piezoelectric or electrostrictive ceramic body, said body comprising a top, four sides generally normal to and interconnected with said top, a base generally normal to and interconnected with said sides, and two or more ceramic layers including a top ceramic layer providing said top, a bottom ceramic layer providing said bottom, and, optionally, one or more intermediate ceramic layers, said layers being superimposed over one another;

wherein each ceramic layer except said top ceramic layer is joined at a first of said sides to one of said ceramic layers adjacent thereto by a first ceramic bridge and each ceramic layer except said bottom ceramic layer is joined at a second of said sides opposite said first side to another of said ceramic layers adjacent thereto by a second ceramic bridge; and wherein first and second cavities extend into said ceramic body from said first and second sides, respectively, said first cavities alternating with said second cavities in said ceramic body, such that said ceramic body has a serpentine cross-section; said body further comprising a first electrode and a second electrode, each of an electrically conductive material, segments of each of said first and second electrodes being disposed at and bonded to only the ceramic surfaces of said first and second sides, respectively, of said body, said first electrode segments being electrically interconnected to one another, and said second electrode segments being electrically interconnected to one another and electrically isolated from said first electrode segments;

wherein said body is poled and electroded in a $d_{33}$ configuration to effect linear expansion of said actuator in a direction normal to said ceramic layers; and said first and second electrodes do not extend into said first and second cavities.

17. A linear actuator in accordance with claim 16 wherein said ceramic body is formed from a piezoelectric or electrostrictive ceramic material selected from the group consisting of lead zirconate titanates; lead magnesium niobates; lead nickel niobates; titanates, tungstates zirconates and niobates of lead barium, bismuth and strontium; and derivatives thereof.

18. A linear actuator in accordance with claim 16 wherein each of said cavities is unfilled or is filled with a compliant material selected from the group consisting of polymer resins and rubbers of lower stiffness than said ceramic body.

19. A linear actuator in accordance with claim 16 wherein said ceramic body includes a plate portion adjacent to and unitary with one side of said actuator such that, on activation, said adjacent side is constrained by said plate portion causing said actuator to bend.

20. A linear actuator in accordance with claim 16 wherein said actuator includes a plate bonded to one side of said actuator such that, on activation, said bonded side is constrained by said plate causing said actuator to bend.

21. A linear actuator in accordance with claim 20 wherein said plate includes plate portions extending into and bonded to said second cavities of said body, said plate portions being of lower stiffness than said ceramic body.

22. A linear actuator in accordance with claim 21 wherein said plate is a polymer material cast or molded onto said actuator.

23. A linear actuator in accordance with claim 16 wherein said actuator includes two of said serpentine-shaped ceramic bodies, each having said first and second electrodes bonded thereto, one side of each body being bonded to opposing sides of a plate such that, on activation of said bodies alternately with one another, said bonded body sides being constrained by said plate, said actuator bends in alternating and opposite directions.

24. A linear actuator in accordance with claim 23 wherein said plate includes plate portions extending into and bonded to said second cavities of each of said bodies.

25. A linear actuator in accordance with claim 24 wherein said plate is a polymer material cast or molded onto said actuator.

26. A linear actuator in accordance with claim 16 wherein said actuator includes two of said serpentine-shaped ceramic bodies, each having said first and second electrodes bonded thereto, one side of each body being bonded to the same side of the other of said bodies such that, on activation of said bodies alternately with one another, said bonded body sides being constrained by said bonding, said actuator bends in alternating and opposite directions.

27. A linear actuator in accordance with claim 16 wherein said actuator in its non-activated state is under compression in the direction of linear expansion.

28. A linear actuator in accordance with claim 16 wherein each of said bridges of said ceramic body includes chamfered or radiused edges at points of strain.

29. A piezoelectric linear actuator comprising:

a unitary densified, rigid, monolithic, poled piezoelectric or electrostrictive ceramic body, said body comprising a top, four sides generally normal to and interconnected with said top, a base generally normal to and interconnected with said sides, and two or more ceramic layers including a top ceramic layer providing said top, a bottom ceramic layer providing said bottom, and, optionally, one or more intermediate ceramic layers, said layers being superimposed over one another;

wherein each ceramic layer except said top ceramic layer is joined at a first of said sides to one of said ceramic layers adjacent thereto by a first ceramic bridge and each ceramic layer except said bottom ceramic layer is joined at a second of said sides opposite said first side to another of said ceramic layers adjacent thereto by a second ceramic bridge; and wherein first and second cavities extend into said ceramic body from said first and second sides, respectively, said first cavities alternating with said second cavities in said ceramic body, such that said ceramic body has a serpentine cross-section; said body further comprising a first serpentine-shaped electrode and a second serpentine-shaped electrode, each of an electrically conductive material, each of said first and second electrodes being disposed at and bonded to a serpentine-shaped ceramic surface of said third and fourth sides, respectively, of said body;

wherein said body is poled and electroded in a $d_{31}$ configuration to effect linear expansion of said actuator in a direction normal to said ceramic layers; and said first and second electrodes do not extend into said first and second cavities.

30. A linear actuator in accordance with claim 29 wherein said ceramic body is formed from a piezoelectric or electrostrictive ceramic material selected from the group consisting of lead zirconate titanates; lead magnesium niobates; lead nickel niobates; titanates, tungstates zirconates and niobates of lead barium, bismuth and strontium; and derivatives thereof.

31. A linear actuator in accordance with claim 29 wherein each of said cavities is unfilled or is filled with a compliant material selected from the group consisting of polymer resins and rubbers of lower stiffness than said ceramic body.

32. A linear actuator in accordance with claim 29 wherein said ceramic body includes a plate portion adjacent to and unitary with one side of said actuator such that, on activation, said adjacent side is constrained by said plate portion causing said actuator to bend.

33. A linear actuator in accordance with claim 29 wherein said actuator includes a plate bonded to one side of said actuator such that, on activation, said bonded side is constrained by said plate causing said actuator to bend.

34. A linear actuator in accordance with claim 33 wherein said plate includes plate portions extending into and bonded to said second cavities of said body, said plate portions being of lower stiffness than said ceramic body.

35. A linear actuator in accordance with claim 34 wherein said plate is a polymer material cast or molded onto said actuator.

36. A linear actuator in accordance with claim 29 wherein said actuator includes two of said serpentine-shaped ceramic bodies, each having said first and second electrodes bonded thereto, one side of each body being bonded to opposing sides of a plate such that, on activation of said bodies alternately with one another, said bonded body sides being constrained by said plate, said actuator bends in alternating and opposite directions.

37. A linear actuator in accordance with claim 36 wherein said plate includes plate portions extending into and bonded to said second cavities of each of said bodies.

38. A linear actuator in accordance with claim 37 wherein said plate is a polymer material cast or molded onto said actuator.

39. A linear actuator in accordance with claim 29 wherein said actuator includes two of said serpentine-shaped ceramic bodies, each having said first and second electrodes bonded thereto, one side of each body being bonded to the same side of the other of said bodies such that, on activation of said bodies alternately with one another, said bonded body sides being constrained by said bonding, said actuator bends in alternating and opposite directions.

40. A linear actuator in accordance with claim 29 wherein said actuator in its non-activated state is under compression in the direction of linear expansion.

41. A linear actuator in accordance with claim 29 wherein each of said bridges of said ceramic body includes chamfered or radiused edges at points of strain.

* * * * *